United States Patent [19]
Tan et al.

[11] Patent Number: 6,134,464
[45] Date of Patent: Oct. 17, 2000

[54] MULTI-SLICE AND MULTI-ANGLE MRI USING FAST SPIN ECHO ACQUISITION

[75] Inventors: Gousheng Tan; Matthew A. Bernstein, both of Waukesha; Steven M. Metcalfe, Delafiend, all of Wis.

[73] Assignee: General Electric Company, Milwaukee, Wis.

[21] Appl. No.: 09/012,509

[22] Filed: Jan. 23, 1998

Related U.S. Application Data

[60] Provisional application No. 60/059,338, Sep. 19, 1997.

[51] Int. Cl.[7] .................................................. A61B 5/055
[52] U.S. Cl. ......................................... 600/410; 324/309
[58] Field of Search .................................... 324/307, 309; 600/410, 420

[56] References Cited

U.S. PATENT DOCUMENTS

| | | | |
|---|---|---|---|
| 4,715,383 | 12/1987 | Ehman et al. | 128/653 |
| 4,871,966 | 10/1989 | Smith et al. | 324/309 |
| 5,694,935 | 12/1997 | Damadian | 600/420 |
| 5,724,970 | 3/1998 | Votruba et al. | 600/410 |
| 5,755,665 | 5/1998 | Takahashi et al. | 600/410 |

*Primary Examiner*—Ruth S. Smith
*Attorney, Agent, or Firm*—Quarles & Brady; Christian G. Cabou; Phyllis Y. Price

[57] ABSTRACT

A fast spin echo (FSE) pulse sequence is employed to perform a multi-slice, multi-angle MRI scan. The slices are scanned in groups, with all the slices in each group being oriented at the same angle and sampled in an interleaved manner. Total scan time is reduced by acquiring multiple, separately phase encoded echo signals during each FSE pulse sequence. Presaturation bands may be produced for each group of slices to reduce flow artifacts in the reconstructed slice images.

10 Claims, 4 Drawing Sheets

MULTI-SLICE AND MULTI-ANGLE MRI USING FAST SPIN ECHO ACQUISITION

This application claims the benefit of U.S. Provisional Application No. 60/059,338, filed on Sep. 19, 1997.

BACKGROUND OF THE INVENTION

The field of the invention is nuclear magnetic resonance imaging methods and systems. More particularly, the invention relates to multi-slice, multi-angle acquisition of NMR data.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The concept of acquiring NMR imaging data in a short time period has been known since 1977 when the echo-planar pulse sequence was proposed by Peter Mansfield (J. Phys. C.10: L55–L58, 1977). In contrast to standard pulse sequences, the echo-planar pulse sequence produces a set of NMR signals for each RF excitation pulse. These NMR signals can be separately phase encoded so that an entire scan of 64 views can be acquired in a single pulse sequence of 20 to 100 milliseconds in duration. The advantage of echo-planar imaging ("EPI") are well-known, and there has been a long felt need for apparatus and methods which will better enable EPI to be practiced in a clinical setting. Other echo-planar pulse sequences are disclosed in U.S. Pat. Nos. 4,678,996; 4,733,188; 4,716,369; 4,355,282; 4,588,948 and 4,752,735.

A variant of the echo-planar imaging method is the Rapid Acquisition Relaxation Enhanced (RARE) sequence which is described by J. Hennig et al in an article in *Magnetic Resonance in Medicine* 3, 823–833 (1986) entitled "RARE Imaging: A Fast Imaging Method for Clinical MR." The essential difference between the RARE sequence and the EPI sequence lies in the manner in which echo signals are produced. The RARE sequence, utilizes RF refocused echoes generated from a Carr-Purcell-Meiboom-Gill sequence, while EPI methods employ gradient recalled echoes.

Both of these fast imaging methods involve the acquisition of multiple spin echo signals from a single excitation pulse in which each acquired echo signal is separately phase encoded. Each pulse sequence, or "shot," therefore results in the acquisition of a plurality of views. However, a plurality of shots are typically employed to acquire a complete set of image data when the RARE fast spin echo sequence is employed. For example, a RARE pulse sequence might acquire 8 or 16 separate echo signals, per shot, and an image requiring 256 views would, therefore, require 32 or 16 shots respectively.

In nearly all two-dimensional clinical scans the NMR data are acquired for a plurality of slice images. The acquisition of many slices can be achieved without increasing the scan time because much of the scan time is otherwise wasted waiting for the longitudinal magnetization to recover. By "interleaving" the pulse sequences for different slices within each TR period, this otherwise idle time is used to acquire additional slices.

In most clinical scans the slices acquired during an interleaved scan are disposed one next to the other in parallel planes. However, there are clinical applications in which the slices are not parallel. On application, for example, is imaging the spinal column where slices through various vertebrae are oriented at different angles due to the curvature in the spine. As disclosed in U.S. Pat. No. 4,871,966, to acquire data in an interleaved scan from slices oriented at different angles, it is necessary to change the imaging gradients during the scan to rotate the separate slices to the required orientations. One of the difficulties with such multi-angle, interleaved scans is that flow artifact suppression techniques such as that disclosed in U.S. Pat. No. 4,715,383 cannot be used with maximum effectiveness. This method employs a saturation rf pulse prior to each set of interleaved pulse sequences to suppress the signal from flowing spins "up-stream" from the image slices. For maximum effectiveness, the saturation band should be virtually contiguous with the set of image slices and this in not possible when the interleaved slices are oriented at different angles and spaced apart in different groups.

Another clinical application in which multiple-slices are acquired at different angles is imaging of the temporomandibular joint (TMJ). In this case the separate slices may intersect in their field of view, and if they are all acquired in the same TR period as taught in U.S. Pat. No. 4,871,966, spins at the intersections will become saturated and their NMR signals will become reduced in amplitude.

SUMMARY OF THE INVENTION

The present invention is a method for acquiring data from a plurality of image slices oriented at different angles. More specifically, the method of this invention employs a fast spin echo pulse sequence to acquire a set of n echo signals from an image slice, the pulse sequence is repeated m times during each TR period to acquire n echo signals from m separate but parallel slices, and after all the NMR data are acquired from the m separate slices, the process is repeated for an additional set of parallel slices oriented at a different angle from the m separate slices. A presaturation rf pulse is produced to suppress image artifacts in the m separate slices.

A general object of the invention is to perform a multi-slice, multi-angle scan in which NMR data are acquired from slices oriented at the same angle during each TR period. This enables a presaturation pulse to be applied which saturates a band that is virtually contiguous with the set of n slices.

Another object of the invention is to perform a multi-slice, multi-angle scan in which the total scan time is comparable to that of interleaved, multi-slice, multi-angle scans. Rather than interleaving slices at different angles during each TR period, the present invention acquires n views of each of the m slices during each TR period. If n is set equal to the number of different slice angles from which data are to be acquired during the scan, the total scan time is the same as an interleaved, multi-slice, multi-angle scan.

Yet another object of the invention is to perform a multi-slice, multi-angle scan in which artifacts due to spin saturation at slice intersections is avoided. Since the NMR data are acquired in different TR periods from slices oriented at different angles, spins at the intersection of slices are not saturated. Resulting image artifacts are thus eliminated.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
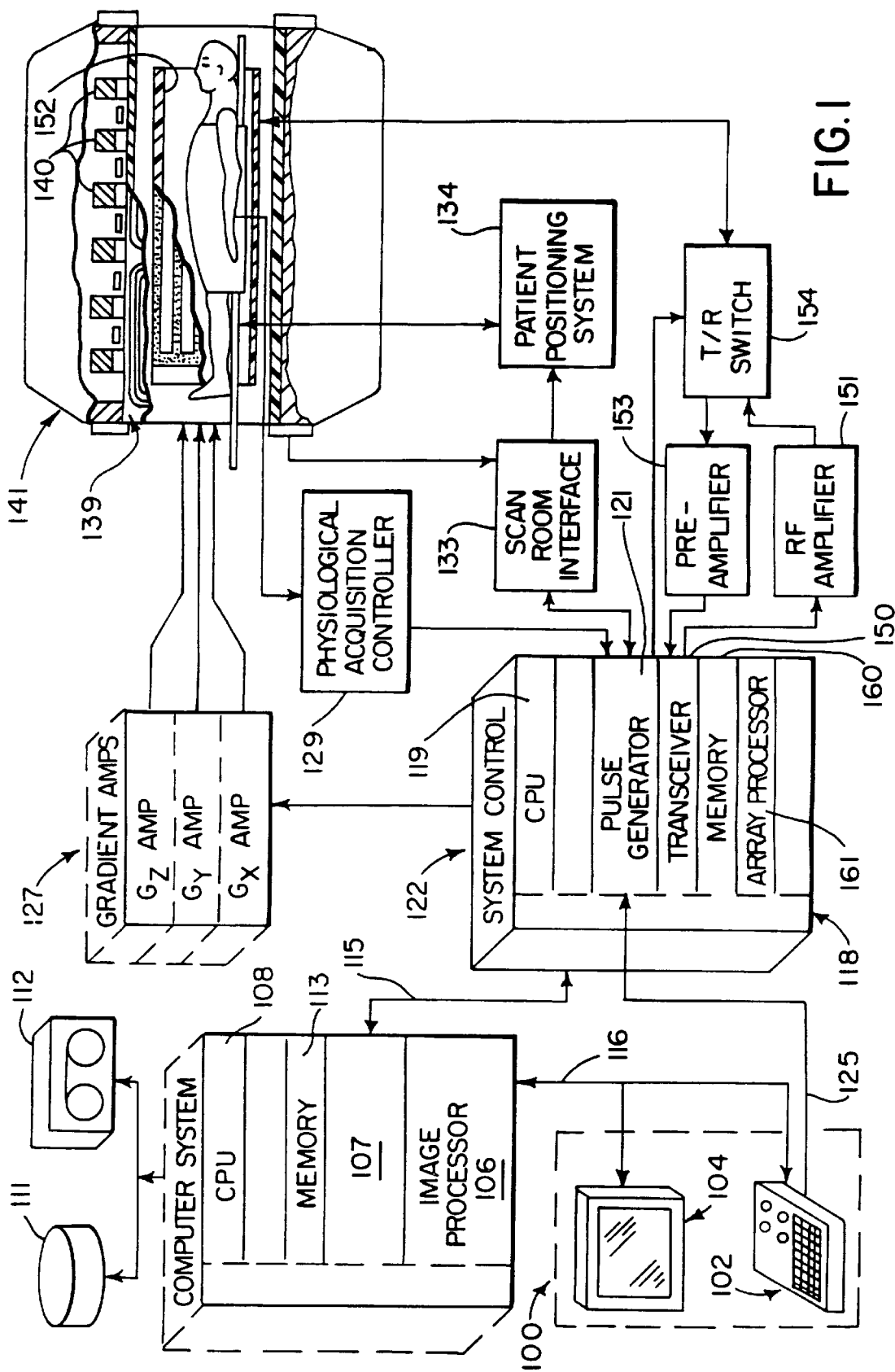
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, amplitude and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprising $G_x$, $G_y$ and $G_z$ amplifiers. Each gradient amplifier drives a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals emitted by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RP amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data are conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

For a more detailed description of the transceiver 150, reference is made to U.S. Pat. Nos. 4,952,877 and 4,922,736 which are incorporated herein by reference.

Figure 2:
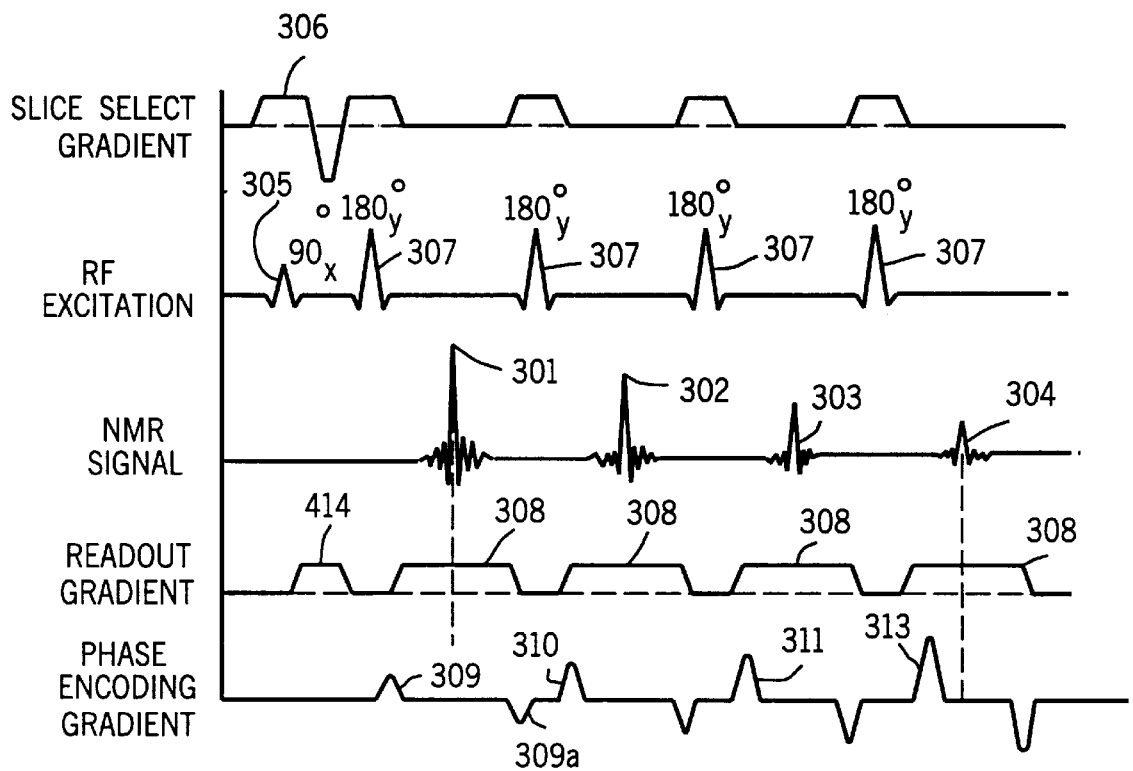
FIG. 2 is a graphic representation of a preferred fast spin echo pulse sequence used to practice the present invention.

Referring particularly to FIG. 2, the fast spin echo MR pulse sequence employed to practice the preferred embodiment of the invention is a 2DFT RARE sequence in which a plurality of MR echo signals are acquired. For clarity, only four echo signals 301–304 are shown in FIG. 2, but it can be appreciated that more or less may be produced and acquired. These MR echo signals are produced by a 90 degree RF excitation pulse 305 which is generated in the presence of a $G_z$ slice select gradient pulse 306 to provide transverse magnetization in a slice through the patient. This transverse magnetization is refocused by selective refocusing pulses 307 (which may have 180° flip angle) to produce the MR spin echo signals 301–304 that are acquired in the presence of $G_x$ readout gradient pulses 308. Each MR spin echo signal 301–304 is separately phase encoded and subsequently rewound by respective $G_y$ phase encoding pulses 309–313. The amplitude of the phase encoding pulse varies and it is stepped through discrete values to acquire separate "views", or samples of $k_y$ space. Each MR spin echo signal is acquired by digitizing samples of each signal, and as a result, at the completion of a scan for one image, a two-dimensional array of "k-space" data are acquired from which an image may be produced by performing a 2D Fourier transformation as described above.

Since the amplitude of the MR spin echo signals 301–304 decrease as a function of the $T_2$ decay constant of the spins being imaged, a number of measures are taken to reduce the spacing between the echo signals. These measures include the application of RF echo pulses 307 with minimal duration, and the use of high bandwidth and/or lower resolution readouts. Both result in less time to play out the associated gradient waveforms with a consequent reduction in the spacing between the MR signals 301–304. The RF refocusing pulses 307 are designed using the methods disclosed in U.S. Pat. Nos. 5,315,249 and 5,345,176 and their duration is reduced, for example, from 3.2 ms to 1.92 ms. The duration of the 90 degree RF excitation pulse 305 is reduced from 4 ms to 2.4 ms. The duration of the readout of each MR echo signal is reduced by using in-plane zero padding in the reconstruction process. This is a well-known technique which enables fewer k-space samples to be acquired along the x or y axes. The missing samples are filled in with zeroes. In the preferred embodiment this enables fewer than 256 samples to be acquired during the readout of each MR signal 301–304 with a consequent reduction in echo spacing.

And finally, the method described in U.S. Pat. No. 5,399,969 entitled "Analyzer of Gradient Power Usage For Oblique MRI Imaging" is used to enable all of the gradient pulses in the FSE pulse sequence to be efficiently and conveniently produced for the prescribed oblique slice angle. The current limitations of the gradient amplifiers 127 are taken into consideration and the shortest duration gradient pulses are produced within these current limits. Absent this feature, the gradient pulse amplitude must be derated for the worst case situation thus requiring an extension of its duration and a resulting increase in echo spacing.

Figure 3:
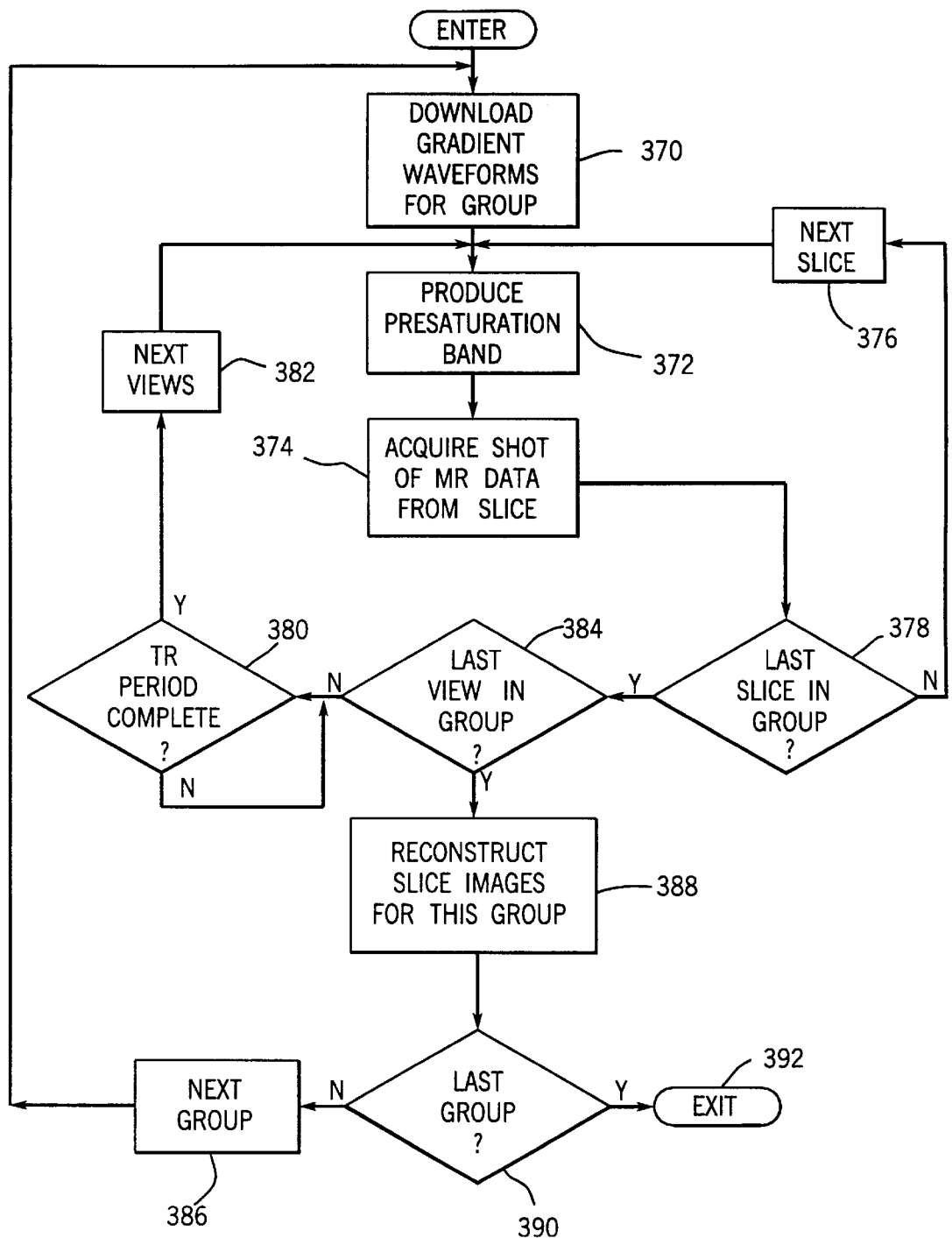
FIG. 3 is a flow chart of the scan performed by the MRI system of FIG. 1 using the pulse sequence of FIG. 2.

The FSE scan of the preferred embodiment of the invention is performed under the direction of a program executed by the MR system of FIG. 1. The steps performed by this program are shown in FIG. 3, and it will be explained using an example scan illustrated in FIG. 4. A complete scan of multiple slices at multiple angles, or orientations is performed using the present method. In this example of FIG. 4, five vertebrae in the spinal column 350 are to be imaged. Five image slices are to be acquired through each vertebrae, and each "group" of slices 352–356 is oriented at a different angle. The spins located to one side of each group 352–356 are to be saturated to suppress flow artifacts as taught in U.S. Pat. No. 4,715,383 which is incorporated herein by reference. These saturation bands are indicated by dashed lines 358–362 and they are substantially contiguous with respective slice groups 352–356 and oriented at the same angles. The location and orientation of each group of slices 352–356, as well as the number of slices in each group, is specified by the operator along with the particular parameters to be used by the FSE pulse sequence. In the example, five slices are acquired in each group and the number of MR echoes acquired in each FSE "shot" is set to five (i.e., ETL=5).

Referring particularly to FIG. 3, after the usual pre-scan functions are performed the computer system downloads the gradient waveforms and other pulse sequence parameters to the pulse generator 121 as indicated by process block 370. These parameters are for the first slice group 352 and associated saturation band 358. A presaturation pulse (or pulses if additional saturation bands are prescribed) is produced as indicated at process block 372 and a loop is entered in which MR data are acquired from each slice in the slice group. More specifically, the FSE pulse sequence of FIG. 2 is performed at process block 374 to acquire a set of views (five in the example) from a slice and the frequency of the excitation pulse 305 is then altered at process block 376 to acquire the same set of views from the next slice in the group. When MR data has been acquired from each slice in the group, as determined at decision block 378, the system waits at decision block 380 for the prescribed TR period to expire and then loops back to produce another presaturation pulse at block 372. The phase encoding gradient is changed at process block 382 such that a different set of five views will be acquired from each slice in the group on the next iteration.

When all the phase encoding views have been acquired from the group of slices as determined at decision block 384, the slice images for this group are reconstructed as indicated at process block 388. A 2D k-space data array is acquired for each slice in the group, and the image reconstruction is a 2D FFT of the 2D k-space data array.

The system then loops back to process block 370 to repeat the data acquisition for the next group of slices as indicated by process block 386. New gradient waveforms and presaturation parameters are downloaded to the pulse generator 121 and the process described above for the next group of slices is repeated. When the last group in the scan has been acquired, as indicated by decision block 390, the scan is complete and the process exits at 392.

It should be apparent that a number of advantages are achieved by separately acquiring each group of slices in an interleaved manner rather than acquiring all the slices in one interleaved acquisition. First, the presaturation bands 358–362 can be precisely positioned with respect to each group to maximize the flow artifact suppression. For example, presaturation band 362 is optimally positioned to suppress flow artifacts for slice group 356, but it overlaps some to the slices in group 355. In a single interleaved acquisition this placement could not be done because the presaturation band 362 would saturate spins in the slice group 355. By separately acquiring each group of slices according to the present invention, however, this problem is completely avoided. The same saturation problem can also occur when slices in two groups intersect within the field of view. The present invention avoids the diminished intensity due to the saturation of spin at these intersections.

A further advantage of the present invention is that the slices in a group can be reconstructed as soon as the 2D k-space data arrays are acquired for that group. Thus, the image reconstruction process can be performed even while data for subsequent groups are still being acquired.

Figure 4:
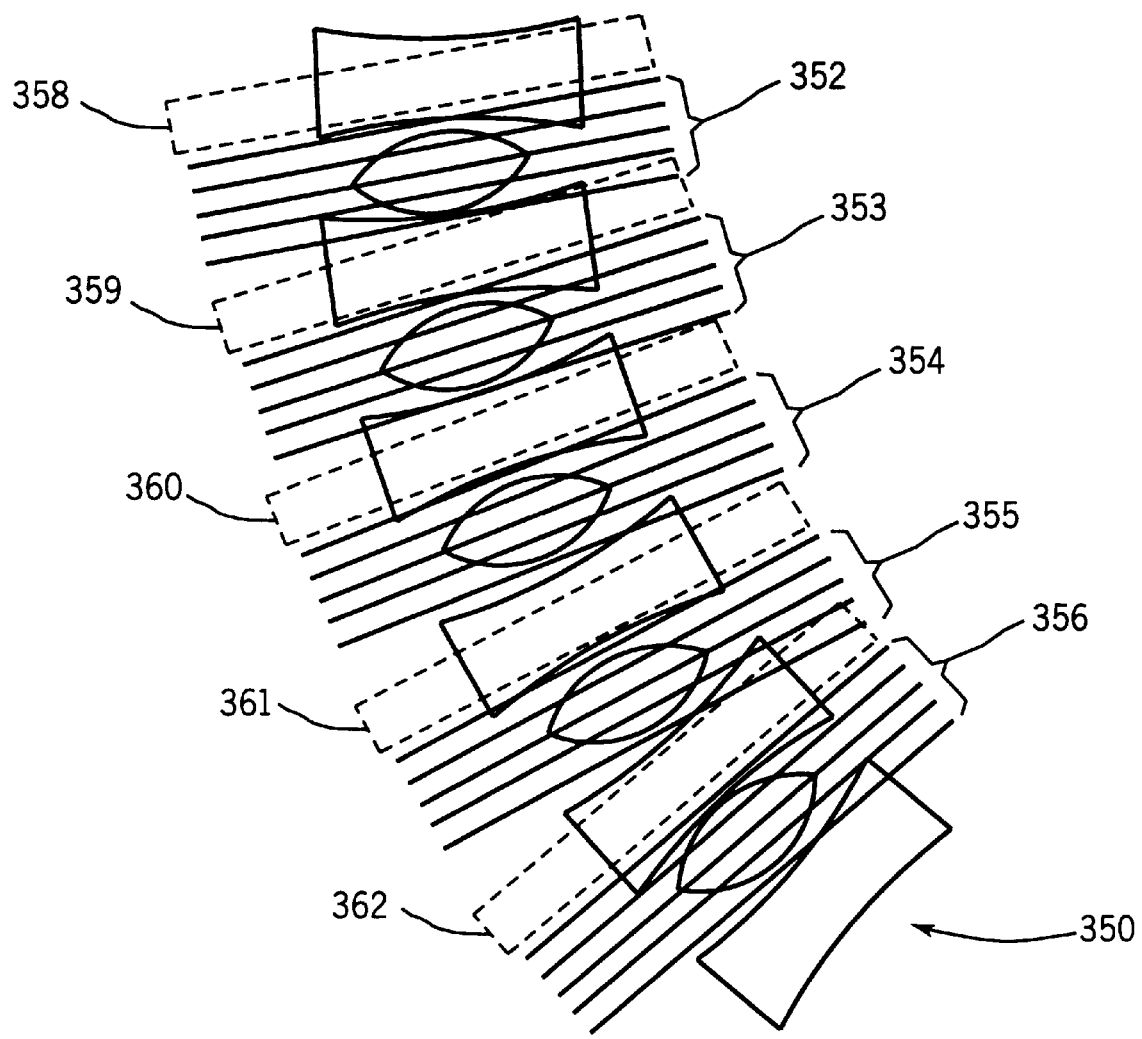
FIG. 4 is a pictorial representation of exemplary slice images acquired of the spine using the scan illustrated in FIG. 3.

It should be noted that the groups of slices may be at much greater angles to each other than as depicted in FIG. 4. In particular, the present invention is useful in acquiring orthogonal slices such as when a saggital and axial image is desired. In such orthogonal image acquisitions, it is likely that the intersection of the slices will be in the region of interest of the slice images. The intersection of the slices, if the slices are acquired in a conventional manner, for example alternating slice acquisitions at orthogonal angles, may create image artifacts bands at the intersections caused by the RF saturation of the tissue at the intersections. The present invention allows orthogonal images to be obtained rapidly without such RF saturation effects.

This feature of the present invention is particularly useful when imaging small structures where only a few groups of slices will be needed and where the intersection of the slices of the groups would inevitably lie in the region of interest.

Particularly in the case of contrast imaging, for example with paramagnetic contrast agents, where the image must be acquired within as little time as possible following the injection of the contrast media, the present invention makes acquisition of two or more orthogonal image sets practical. One example is the imaging of pituitary adenomas where the small volume of the tissue and the use of contrast agents make other imaging techniques less desirable. The present invention, which reduces the scan time, is particularly helpful in studies using contrast agents where pre and post contrast agent images must be obtained. For such studies where orthogonal images are also needed, the benefit of the present invention in shortening scan times is multiplied fourfold.

It should also be apparent that many variations are also possible from the preferred embodiment described herein. For example, the number of slices acquired in each group need not be the same, or even if an equal number of slices are contained in each group data need not be acquired for all the slices in all the groups. Also, the groups need not be a single cluster of nearly contiguous slices, but may comprise more than one such cluster. For example, in $T_2$ weighted imaging it is desirable to increase the number of echoes (ETL) in the FSE pulse sequence, and to reduce total scan time the number of slices per group is increased. In this case the slices in the group may be clustered to image two separate regions of interest (e.g. two separate vertebrae).

What is claimed is:

1. A method for imaging the spine of a subject with an MRI system, the steps comprising:

a) defining a plurality of groups of slices, each group of slices containing a plurality of slices oriented at one of a plurality of different angles and intersecting one of a plurality of different vertebrae in the spine;

b) acquiring MR data from one of said groups of slices by interleaving the acquisition of MR data from each slice in the group using a fast spin echo pulse sequence in which a plurality of MR echo signals are produced;

c) repeating step b) until all the MR data for reconstructing images are acquired from the group of slices;

d) reconstructing images of the vertebrae intersected by the slices in the group from the MR data; and e) repeating steps b), c) and d) for each of the other of said plurality of groups of slices defined in step a) to produce images of the corresponding vertebrae in the spine.

2. The method as recited in claim 1 in which step b) includes producing a presaturation band adjacent the group of slices prior to acquiring MR data therefrom.

3. The method as recited in claim 1 in which step c) includes waiting for a TR period between repetitions of step b).

4. The method as recited in claim 1 in which the number of slices in each group defined in step a) is the same.

5. The method as recited in claim 4 in which MR data are not acquired from some slices in some of the groups of slices.

6. The method as recited in claim 1 in which step d) is performed to reconstruct images for one group of slices while step b) is performed to acquire MR data for another group of slices.

7. The method as recited in claim 1 in which step c) is repeated to acquire MR data for a 2D k-space data array for each slice in the group and a portion of each 2D k-space data array is zero-filled.

8. The method as recited in claim 1 in which the fast spin echo pulse sequence is different for each group of slices.

9. The method as recited in claim 1 in which the fast spin echo pulse sequence includes producing imaging gradient pulses, and the imaging gradient pulses are optimized in duration and amplitude for each group of slices.

10. The method as recited in claim 1 in which slices from one of said groups of slices intersect slices from another of said groups of slices and in which step e) includes waiting for a TR period before repeating steps b), c) and d).

* * * * *